United States Patent
Yoon et al.

(10) Patent No.: US 10,541,670 B2
(45) Date of Patent: Jan. 21, 2020

(54) MICROMECHANICAL RESONATOR AND RESONATOR SYSTEM INCLUDING THE SAME

(71) Applicant: SAMSUNG ELECTRONICS CO., LTD., Suwon-si (KR)

(72) Inventors: Yongseop Yoon, Seoul (KR); Sungchan Kang, Hwaseong-si (KR); Cheheung Kim, Yongin-si (KR); Sangha Park, Seoul (KR); Choongho Rhee, Anyang-si (KR); Hyeokki Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/870,546

(22) Filed: Jan. 12, 2018

(65) Prior Publication Data

US 2019/0028084 A1    Jan. 24, 2019

(30) Foreign Application Priority Data

Jul. 18, 2017 (KR) .......................... 10-2017-0091060

(51) Int. Cl.
*H03B 5/30* (2006.01)
*H03H 3/007* (2006.01)
*H03H 9/24* (2006.01)
*H03H 9/02* (2006.01)

(52) U.S. Cl.
CPC ........ *H03H 9/2405* (2013.01); *H03H 3/0076* (2013.01); *H03H 9/2457* (2013.01); *H03B 5/30* (2013.01); *H03H 2009/02291* (2013.01); *H03H 2009/02488* (2013.01)

(58) Field of Classification Search
CPC .............. H01L 41/0933; H01L 41/094; H01L 41/1134; H01L 41/1136; H03B 5/30; H03B 5/32; H03H 3/0072; H03H 3/0076; H03H 9/0244; H03H 9/2405; H03H 9/2447; H03H 9/2457; H03H 2003/022; H03H 2009/02291; H03H 2009/02488
USPC .................................................. 331/154, 156
See application file for complete search history.

(56) References Cited

U.S. PATENT DOCUMENTS

| | | | |
|---|---|---|---|
| 5,856,722 A | 1/1999 | Haronian et al. | |
| 9,479,884 B2 | 10/2016 | Kim | |
| 10,135,365 B2 * | 11/2018 | Procopio | ............. H01L 41/1136 |
| 2009/0167450 A1 * | 7/2009 | Shinogi | .................... H02M 3/16 |
| | | | 331/156 |
| 2009/0284102 A1 * | 11/2009 | Karakaya | ................ F16F 15/02 |
| | | | 310/321 |

(Continued)

FOREIGN PATENT DOCUMENTS

| | | |
|---|---|---|
| EP | 1909079 A1 | 4/2008 |
| JP | 2000-201391 A | 7/2000 |

(Continued)

*Primary Examiner* — Levi Gannon
(74) *Attorney, Agent, or Firm* — Sughrue Mion, PLLC (57) ABSTRACT

Provided are micromechanical resonators and resonator systems including the micromechanical resonators. The micromechanical resonators may each include a supporting beam including a fixed end fixed on a supporting member and a loose end configured to vibrate, and a lumped mass arranged on the loose end, wherein the loose end has a width greater than a width of the fixed end, and a width of the lumped mass is greater than that the width of the fixed end.

15 Claims, 7 Drawing Sheets

(56) References Cited

U.S. PATENT DOCUMENTS

| | | | |
|---|---|---|---|
| 2011/0140579 A1* | 6/2011 | Moon | H01L 41/1136 310/339 |
| 2012/0187507 A1* | 7/2012 | Bontemps | H03H 3/0076 257/416 |
| 2012/0298165 A1* | 11/2012 | Kurihara | H01L 35/32 136/230 |
| 2013/0293069 A1* | 11/2013 | Sakaguchi | H02N 2/186 310/348 |
| 2014/0303688 A1* | 10/2014 | Kulah | A61N 1/3785 607/57 |
| 2015/0135869 A1* | 5/2015 | Jia | H02N 2/188 74/96 |
| 2015/0180449 A1* | 6/2015 | Umeda | H03H 3/0072 310/370 |
| 2015/0263699 A1* | 9/2015 | Lutz | H03H 3/0076 331/154 |
| 2016/0197597 A1* | 7/2016 | Yamada | H03H 3/0072 310/311 |
| 2018/0138886 A1 | 5/2018 | Yoon et al. | |

FOREIGN PATENT DOCUMENTS

| | | |
|---|---|---|
| KR | 10-1092926 B1 | 12/2011 |
| KR | 10-2016-0020287 A | 2/2016 |

* cited by examiner

MICROMECHANICAL RESONATOR AND RESONATOR SYSTEM INCLUDING THE SAME

CROSS-REFERENCE TO RELATED APPLICATION

This application claims the priority from Korean Patent Application No. 10-2017-0091060, filed on Jul. 18, 2017 in the Korean Intellectual Property Office, the disclosure of which is incorporated herein in its entirety by reference.

BACKGROUND

1. Field

Example embodiments of the present disclosure relate to micromechanical resonators configured to have low frequency characteristics, and resonator systems including the same.

2. Description of the Related Art

A micromechanical resonator for analyzing an acoustic characteristic or a vibration characteristic mainly uses a cantilever beam structure. The cantilever beam structure may be operated in a state in which an end thereof vibrates while another end thereof is fixed.

The micromechanical resonator may be used for analyzing acoustic or voice information in mobile electronic devices or vehicles.

In addition, the micromechanical resonator may measure bio-information such as heart rate by being attached to the skin of a human body or vibration information by being attached to vehicles or electronic devices.

A structure of the micromechanical resonator may vary according to required frequency characteristics. For example, a length of the micromechanical resonator may be increased to lower the frequency characteristic.

However, when the length of the micromechanical resonator is increased, a size of a total resonator system is increased and rigidity of the micromechanical resonator may be reduced.

SUMMARY

One or more example embodiments provide micromechanical resonators having a reduced size and a lower required frequency characteristic, and resonator systems including the micromechanical resonators.

One or more example embodiments provide micromechanical resonators having a reduced size, increased sensitivity, and lower frequency characteristic, and resonator systems including the micromechanical resonators.

According to an aspect of an example embodiment, there is provided a micromechanical resonator including a supporting member, a supporting beam including a fixed end fixed on the supporting member and a loose end configured to vibrate, and a lumped mass arranged on the loose end, wherein the loose end has a width greater than a width of the fixed end, and a width of the lumped mass is greater than the width of the fixed end.

The micromechanical resonator may further include a piezoelectric sensor that is arranged on the fixed end, the piezoelectric sensor including a lower electrode, a piezoelectric material layer, and an upper electrode.

The micromechanical resonator, wherein the supporting beam may have a T shape.

The micromechanical resonator, wherein the lumped mass may have a width equal to the width of the loose end.

The micromechanical resonator, wherein the loose end may include a first air flow path configured to allow air to flow therethrough in an upward direction and a downward direction, and the lumped mass may include a second air flow path configured to allow air to flow therethrough in the upward direction and the downward direction, wherein the first air flow path overlaps the second air flow path.

The micromechanical resonator, wherein the first air flow path and the second air flow path may have the same shape.

The micromechanical resonator, wherein the first airflow path and the second air flow path each may have a width equal to or greater than 10 µm.

The micromechanical resonator, wherein the supporting beam may have a length less than or equal to 5 mm.

The micromechanical resonator, wherein the lumped mass may have a thickness less than or equal to 10 µm.

The micromechanical resonator, wherein the micromechanical resonator may have a resonance frequency less than or equal to 500 Hz.

According to an aspect of an example embodiment, there is provided a resonator system including a supporting member, a plurality of micromechanical resonators, each having an end fixed on the supporting member and having resonance frequencies different from each other, wherein the plurality of micromechanical resonators comprise a first micromechanical resonator, a second micromechanical resonator having a length greater than that of the first micromechanical resonator, and a third micromechanical resonator having a length greater than that of the second micromechanical resonator, and, wherein the third micromechanical resonator includes a first supporting beam comprising a first fixed end fixed on the supporting member and a first loose end configured to vibrate and has a width greater than a width of the first fixed end, and a first lumped mass that is arranged on the first loose end and has a width greater than the width of the first fixed end.

The resonator system, wherein each of the first micromechanical resonator and second micromechanical resonator respectively may include a second supporting beam comprising a second fixed end fixed on the supporting member, and a second loose end configured to vibrate and has a width equal to a width of the second fixed end, and a second lumped mass that is arranged on the second loose end and has a width equal to the width of the second fixed end.

The resonator system, wherein the first supporting beam of the third micromechanical resonator may be arranged between the first and second micromechanical resonators.

The resonator system, wherein the third micromechanical resonator may have a resonance frequency less than or equal to 500 Hz, and the first and second micromechanical resonators each may have a resonance frequency greater than 200 Hz.

The resonator system, wherein the first supporting beam may have a T shape.

The resonator system, wherein the first lumped mass may have a width equal to the width of the first loose end.

The resonator system, wherein the first loose end may include a first air flow path configured to allow air to flow therethrough in an upward direction and a downward direction, and the first lumped mass may include a second air flow path configured to allow air to flow therethrough in the upward direction and the downward direction, wherein the first air flow path overlaps the second air flow path.

The resonator system, wherein the first air flow path and second air flow path may have the same shape.

The resonator system, wherein the first air flow path and second air flow path each may have a width equal to or greater than 10 μm.

BRIEF DESCRIPTION OF THE DRAWINGS

The above and/or other aspects will become apparent and more readily appreciated from the following description of the example embodiments, taken in conjunction with the accompanying drawings in which.

DETAILED DESCRIPTION

Hereinafter, example embodiments of micromechanical resonators and resonator systems including the micromechanical resonators will be described with reference to the accompanying drawings. In the drawings, like reference numerals refer to like elements throughout and sizes or thicknesses of constituent elements may be exaggerated for convenience of explanation. In this regard, the example embodiments may have different forms and should not be construed as being limited to the descriptions set forth herein.

As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Figure 1:
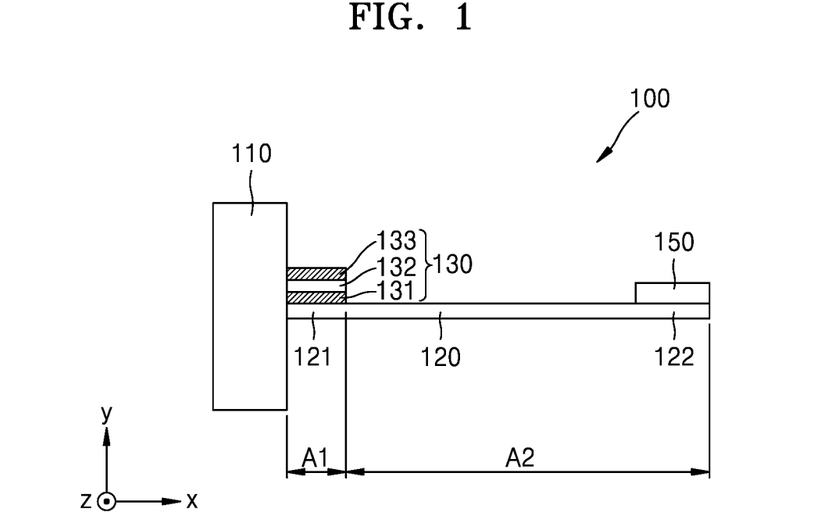
FIG. 1 is a schematic cross-sectional view of a micromechanical resonator according to an example embodiment.

FIG. 1 is a schematic cross-sectional view of a micromechanical resonator 100 according to an example embodiment.

Referring to FIG. 1, the micromechanical resonator 100 may have a cantilever structure. The micromechanical resonator 100 may include a supporting beam 120 of which an end is fixed on a supporting member 110, and a lumped mass 150 arranged on another end of the supporting beam 120.

The supporting member 110 may be a member formed on a mobile electronic device, for example, a mobile phone, or a vehicle.

The supporting beam 120 may have a beam shape, and may be referred to as, for example, a cantilever. The supporting beam 120 may include a fixed end 121 fixed on the supporting member 110 and a loose end 122 capable of vibrating. The supporting beam 120 may have a width in a range from about a few tens of μm to a few hundreds of μm.

The supporting beam 120 may include silicon that is generally used in a semiconductor process. However, the supporting beam 120 according to the example embodiment is not limited thereto, and may include, for example, glass, silicon oxide, or silicon nitride.

The lumped mass 150 may be arranged on the loose end 122. According to the weight of the lumped mass 150, a resonance frequency of the micromechanical resonator 100 may be changed. The lumped mass 150 may include, for example, steel or tungsten. However, a material included in the lumped mass 150 is not limited thereto. For example, the lumped mass 150 may include a metal such as gold (Au).

The micromechanical resonator 100 may further include a piezoelectric sensor 130 arranged on the fixed end 121 of the supporting beam 120. The arrangement of the piezoelectric sensor 130 is not limited thereto. The piezoelectric sensor 130 may be arranged, for example, on an entire surface of the supporting beam 120.

The piezoelectric sensor 130 may include a piezoelectric material layer 132, an upper electrode 133, and a lower electrode 131, the upper and lower electrodes 133 and 131 being respectively arranged on upper and lower sides of the piezoelectric material layer 132.

The upper electrode 133 and the lower electrode 131 of the piezoelectric sensor 130 may include a metal material, such as molybdenum (Mo). The piezoelectric material layer 132 may include any material that is used for a piezoelectric sensor, for example, aluminium nitride (AlN), zinc oxide (ZnO), tin oxide (SnO), lead zirconate titanate (PZT), perovskite zinc stannate ($ZnSnO_3$), polyvinylidene fluoride (PVDF), poly(vinylidene fluoride-trifluoroethylene) (P(VDF-TrFE)), or piezoelectric single crystal (PMN-PT). An insulating layer may be further selectively formed between the lower electrode 131 and the supporting beam 120.

The supporting beam 120 may be divided into a sensing region A1 where the piezoelectric sensor 130 is located and a non-sensing region A2 where the piezoelectric sensor 130 is not located.

In the micromechanical resonator 100 according to the example embodiment, when a vibration, a sound, or a force is applied to the micromechanical resonator 100, an inertial force may be generated according to behavior of the lumped mass 150. When a resonance frequency of the micromechanical resonator 100 coincides with a frequency of an external vibration, sound, or force, a resonance phenomenon may be generated, and in this case, the inertial force may be increased. The inertial force may generate a bending moment on the piezoelectric sensor 130, and the bending moment may generate stress in each layer of the piezoelectric sensor 130. The piezoelectric material layer 132 may generate a charge having a magnitude proportional to the stress applied to the piezoelectric material layer 132, and a voltage may be generated inversely proportional to a capacitance between the upper electrode 133 and the lower electrode 131. As a result, the micromechanical resonator 100 may obtain information about an external force, such as vibration, sound, or force by detecting and analyzing a voltage generated in the piezoelectric sensor 130 due to the external vibration, sound, or force applied to the micromechanical resonator 100.

The micromechanical resonator 100 according to the example embodiment may have a resonance frequency of a lower frequency band. For example, the resonance frequency of the micromechanical resonator 100 may be less than or equal to 200 Hz.

In the micromechanical resonator 100 including the lumped mass 150, a resonance frequency of the supporting beam 120 may be determined according to stiffness of the supporting beam 120 and a weight of the lumped mass 150. The resonance frequency $\omega_n$ of the micromechanical resonator 100 may be determined according to the following Equation 1.

$$\omega_n = \sqrt{k/M} \qquad (1)$$

Here, M indicates a weight of the lumped mass 150, k indicates stiffness of the supporting beam 120, wherein the stiffness is inversely proportional to a cube of a length of the supporting beam 120.

For example, in order for the micromechanical resonator 100 to have a resonance frequency of a lower frequency band, the stiffness of the supporting beam 120 may be reduced or the weight of the lumped mass 150 may be increased compared to the micromechanical resonator 100 having a resonance frequency of a higher frequency band.

The length of the supporting beam 120 may be increased to reduce the stiffness of the supporting beam 120. However, if the length of the supporting beam 120 is increased, the micromechanical resonator 100 increases in size, and deformation or damage to the supporting beam 120 may more likely occur.

A deposition thickness of the lumped mass 150 may be increased to increase a weight of the lumped mass 150. However, considering the supporting beam 120, which is a microstructure having a width in a range from a few tens of μm to a few hundreds of μm, there may be a technical limit and an increase in manufacturing cost in increasing the deposition thickness of the lumped mass 150.

In the micromechanical resonator 100 according to the example embodiment, structures of the supporting beam 120 and the lumped mass 150 to reduce or minimize the increase in a size thereof and to reduce or minimize manufacturing cost thereof while the micromechanical resonator 100 has a resonance frequency of a lower frequency band, are provided.

Figure 2:
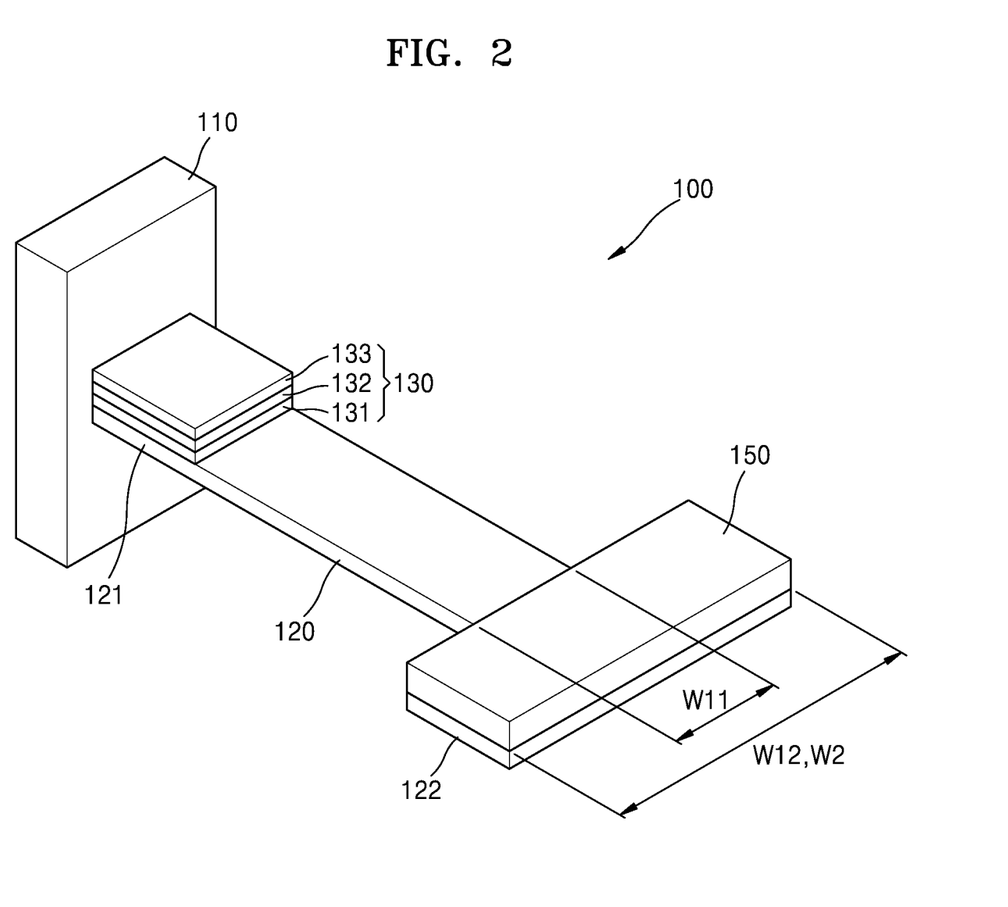
FIG. 2 is a perspective view of a micromechanical resonator according to an example embodiment.

FIG. 2 is a perspective view of the micromechanical resonator 100 according to an example embodiment. Referring to FIG. 2, an example method of increasing a weight of the lumped mass 150 of the micromechanical resonator 100 is provided without increasing a length of the supporting beam 120 and a thickness of the lumped mass 150.

In the supporting beam 120, a width W12 of the loose end 122 may be greater than a width W11 of the fixed end 121. The width W12 of the loose end 122 may be from about 2 times to about 5 times greater than the width W11 of the fixed end 121. If the width W12 of the loose end 122 is greater than 5 times of the width W11 of the fixed end 121, a portion of the loose end 122 may sag due to the weight of the lumped mass 150 arranged thereon. If the width W12 of the loose end 122 is less than 2 times the width W11 of the fixed end 121, it may be more difficult to ensure a weight of the lumped mass 150 for obtaining a resonance frequency in a lower frequency band.

The supporting beam 120 may have a T shape, which may be referred to as a hammer shape.

A width W2 of the lumped mass 150 arranged on the loose end 122 may be greater than the width W11 of the fixed end 121. The width W2 of the lumped mass 150 may be from about 2 times to about 5 times of the width W11 of the fixed end 121. In this case, the weight of the lumped mass 150 may be increased when compared to the lumped mass 150 having a width corresponding to the width W11 of the fixed end 121.

The shape of the lumped mass 150 may correspond to that of the loose end 122. The width W2 of the lumped mass 150 may be equal to the width W12 of the loose end 122.

As described above, the size of the lumped mass 150 arranged on the loose end 122 may be increased in a width direction that crosses a length direction of the supporting beam 120, and thus, a thickness of the lumped mass 150 may not be increased and a length of the supporting beam 120 may be reduced. For example, the thickness of the lumped mass 150 may be less than or equal to 10 μm, and the length of the supporting beam 120 may be less than or equal to 5 mm.

As an example, if the width W2 of the lumped mass 150 is doubled, the weight of the lumped mass 150 may be doubled. In this case, a length of the supporting beam 120 may be reduced by approximately 15%.

Figure 3A:
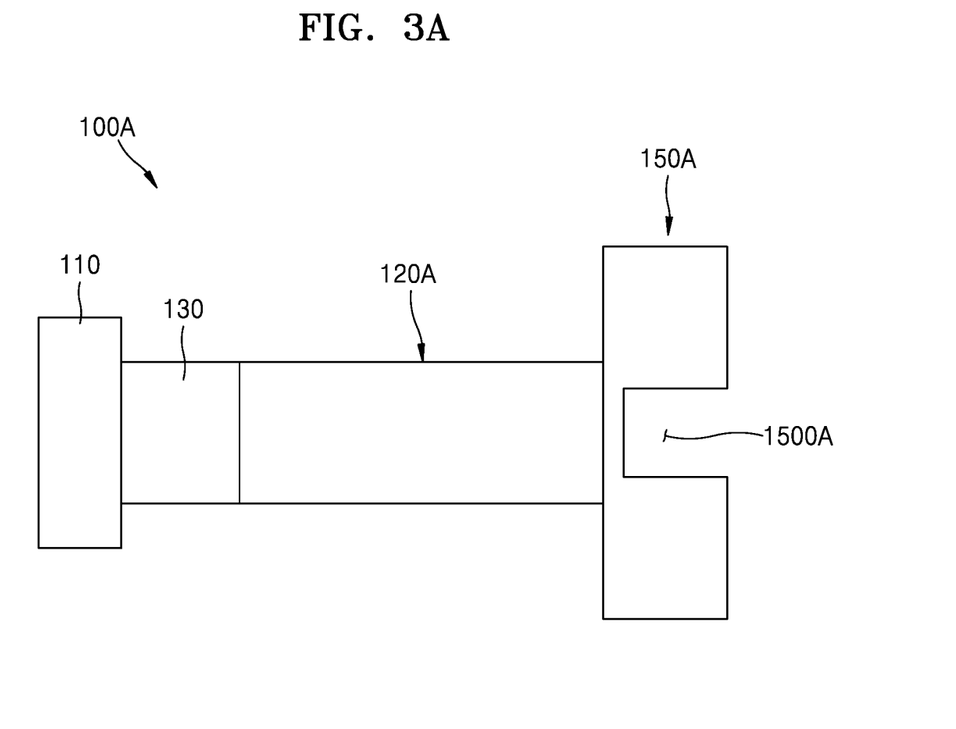
FIGS. 3A and 3B respectively are a plan view and a perspective view of a micromechanical resonator according to an example embodiment.
Figure 3B:
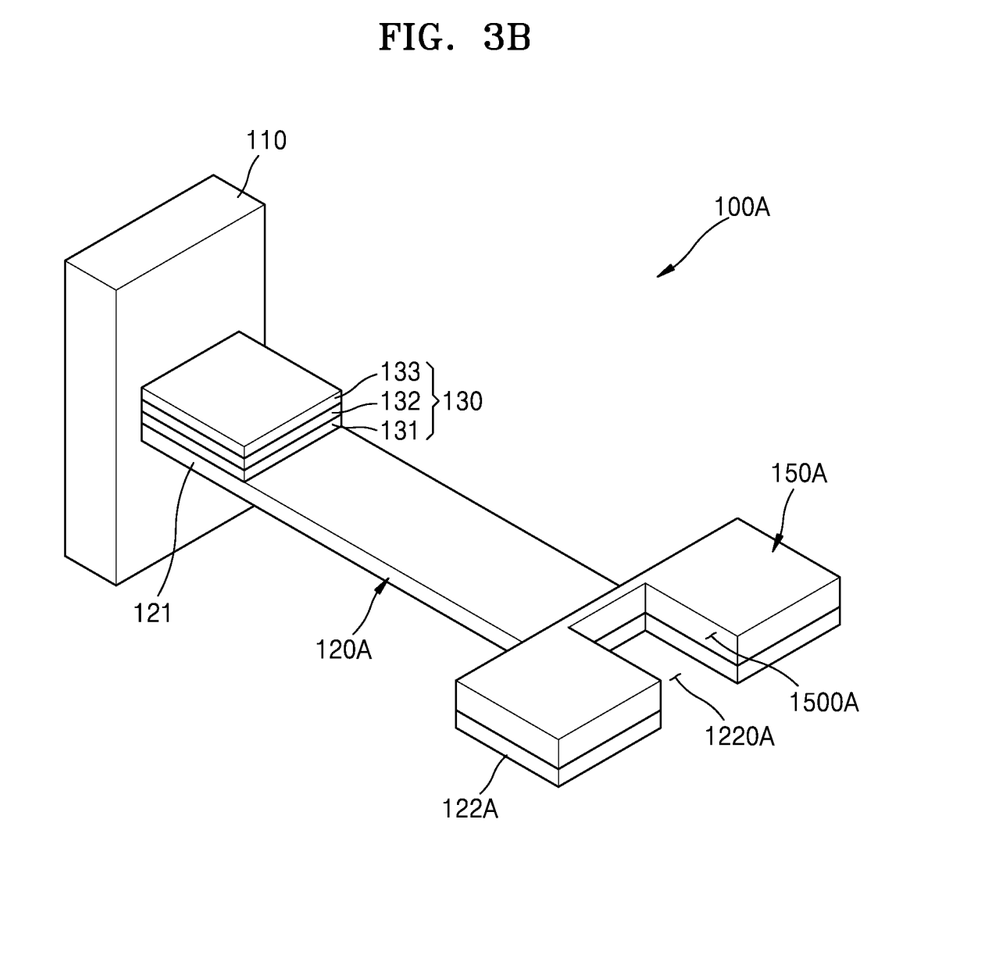
Figure 4A:
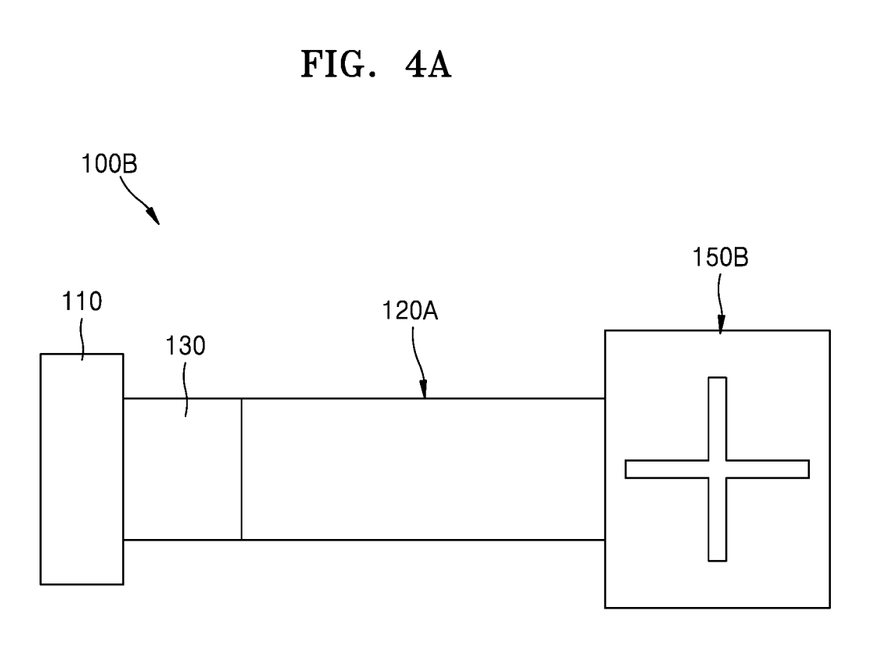
FIGS. 4A and 4B respectively are a plan view and a perspective view of a micromechanical resonator according to an example embodiment.
Figure 4B:
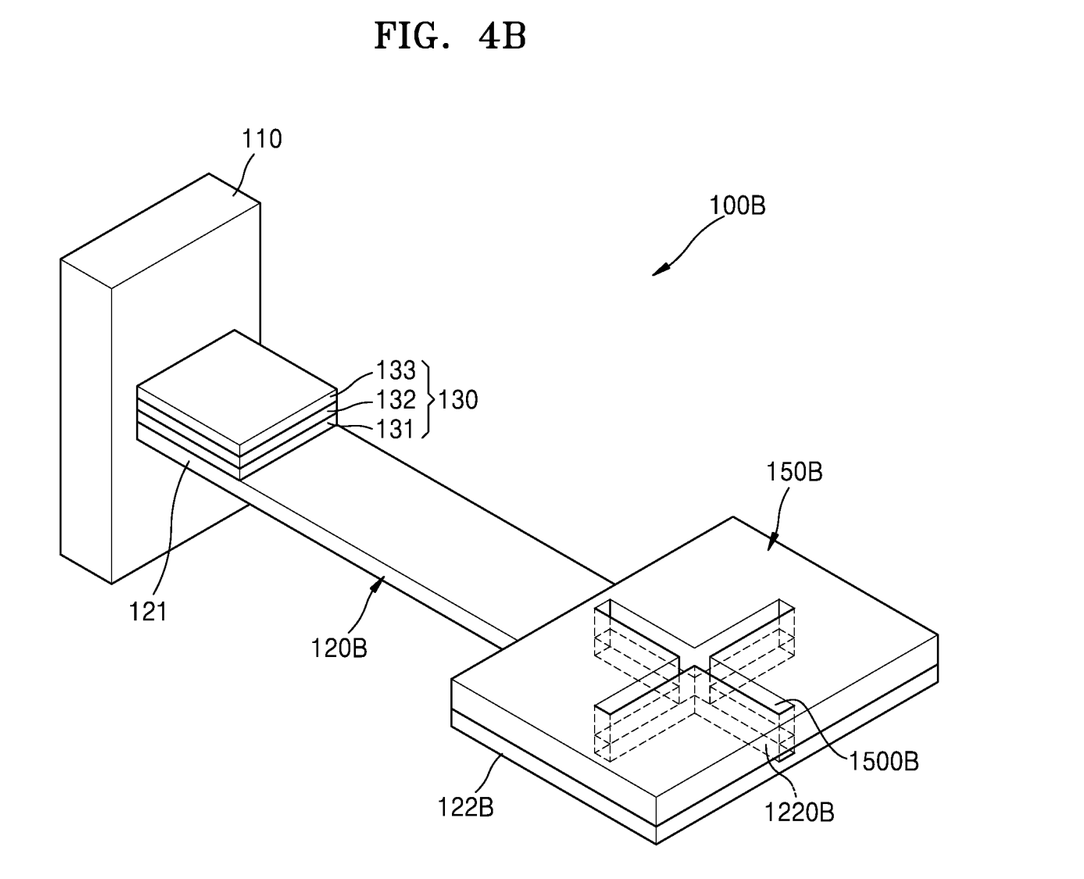

FIGS. 3A and 3B respectively are a plan view and a perspective view of a micromechanical resonator 100A according to an example embodiment. FIGS. 4A and 4B respectively are a plan view and a perspective view of a micromechanical resonator 100B according to example embodiment.

Referring to FIGS. 3A and 3B, the micromechanical resonator 100A according to the example embodiment may include a supporting beam 120A and a lumped mass 150A. The micromechanical resonator 100A may further include the piezoelectric sensor 130.

In the micromechanical resonator 100A, the supporting beam 120A and a loose end 122A may have structures modified from the structures of the supporting beam 120 and the loose end 122 of the micromechanical resonator 100. Like reference numerals are used to indicate substantially like elements, and thus, further descriptions thereof are omitted.

The loose end 122A of the supporting beam 120A may include a first air flow path 1220A through which air flows in upward and downward directions. The lumped mass 150A may overlap the first air flow path 1220A and may include a second air flow path 1500A through which air flows in the upward and downward directions.

When the width W12 of the loose end 122 of the supporting beam 120 and the width W2 of the lumped mass 150 arranged on the loose end 122 are increased, air resistance that may occur when the loose end 122 is vibrated may increase. However, in the micromechanical resonator 100A according to the example embodiment, when the loose end 122A of the supporting beam 120A is vibrated in the upward and downward directions, air may flow in the upward and downward directions through the first air flow path 1220A and the second air flow path 155A, and thus, the air resistance that may occur when the supporting beam 120A is vibrated may be reduced. In addition, the increase in the weight of the lumped mass 150A increases an inertia force, and accordingly, a bending moment applied to the piezoelectric sensor 130 may be increased. As a result, a sensitivity of the micromechanical resonator 100A may be increased.

The first and second air flow paths 1220A and 1500A may have a width that allows air to flow therethrough. The first air flow path 1220A may have a width equal to or greater than 10 μm. The second air flow path 1500A may have a width equal to or greater than 10 μm. The widths of the first and second air flow paths 1220A and 1500A may be smaller than a width of the fixed end 121.

The first and second air flow paths 1220A and 1500A may have any shape as long as air may flow therethrough. For example, as depicted in FIG. 3A, the first and second air flow paths 1220A and 1500A may have a rectangular shape. As another example, as depicted in FIGS. 4A and 4B, first and second air flow paths 1220B and 1500B formed on a loose end 122B of a supporting beam 120B and a lumped mass 150B of the micromechanical resonator 100B may have a cross shape.

Figure 5:
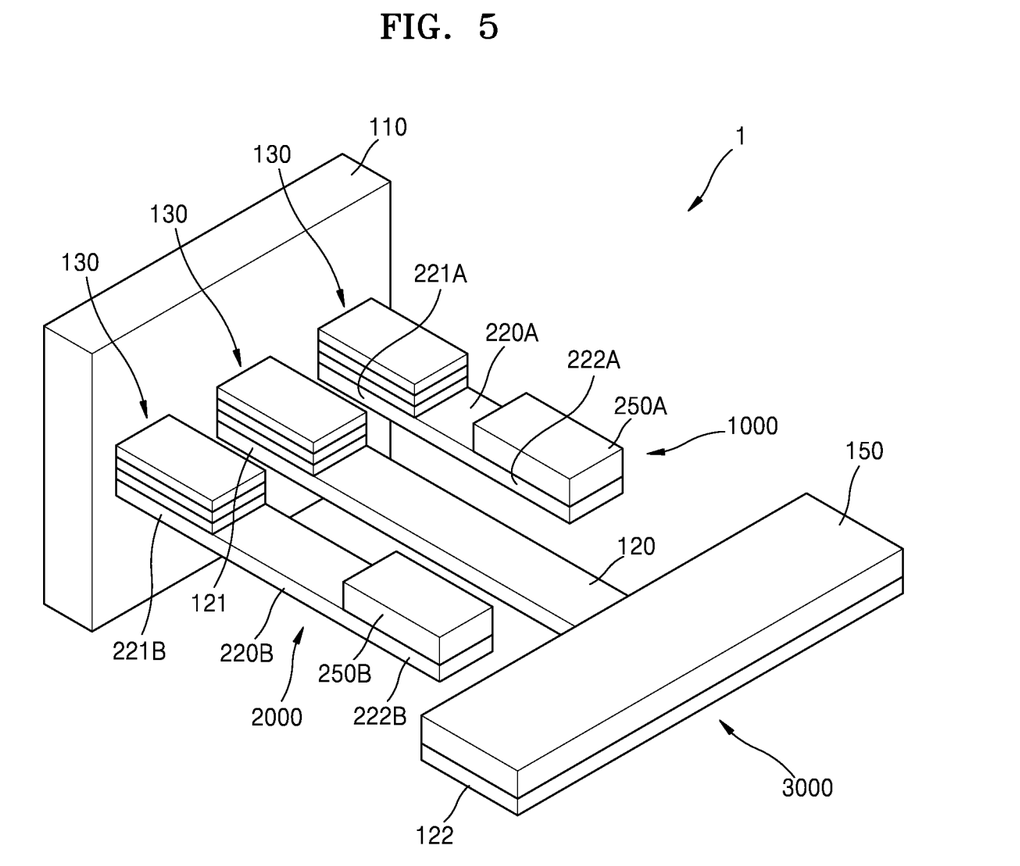
FIG. 5 is a perspective view of a resonator system according to an example embodiment.
Figure 6:
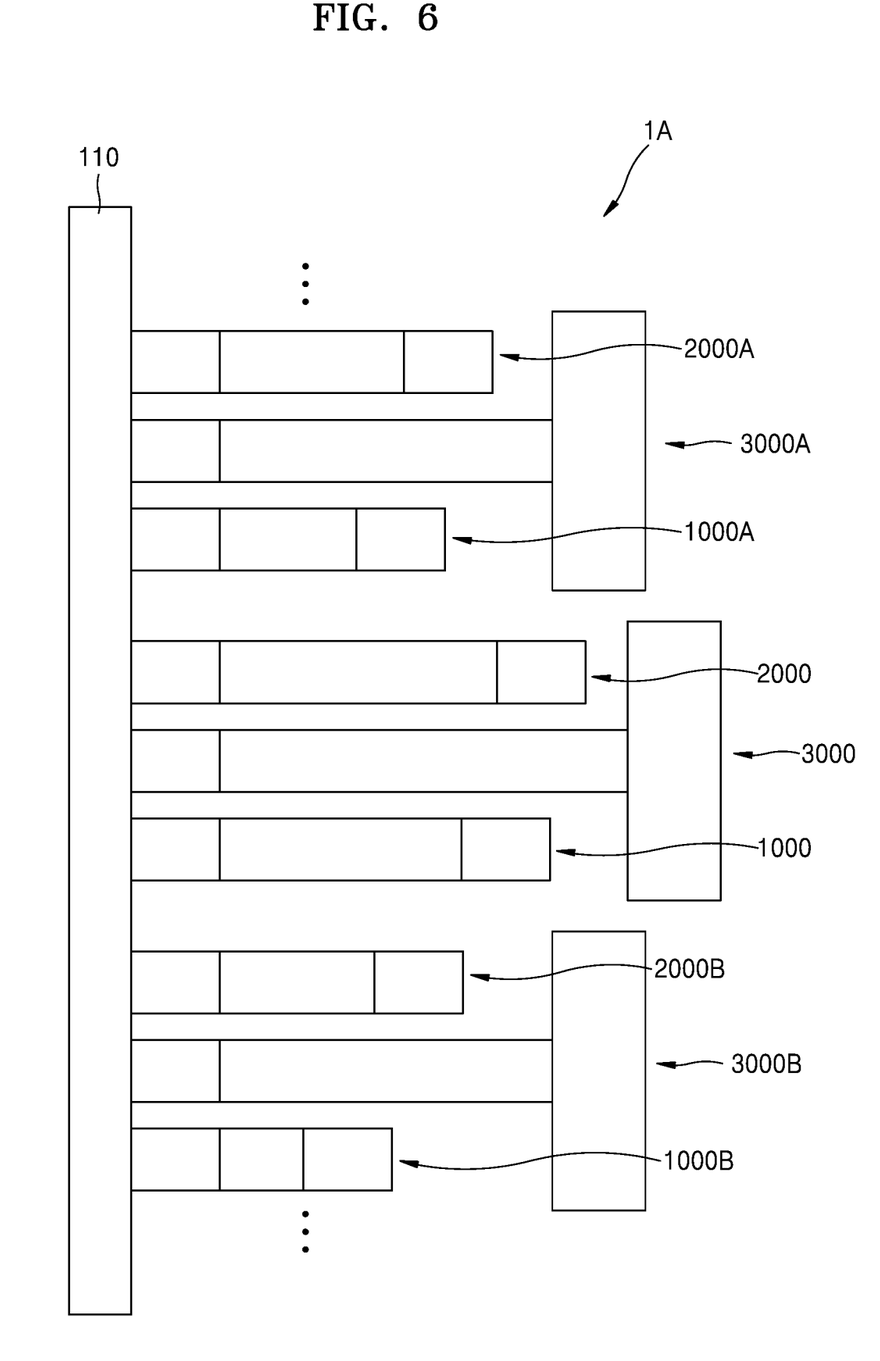
FIG. 6 is a plan view of an example resonator system including an array device to which the resonator system of FIG. 5 is applied.

FIG. 5 is a perspective view of a resonator system 1 according to an example embodiment. FIG. 6 is a plan view of a resonator system 1A including an array device to which the resonator system 1 of FIG. 5 is applied.

Referring to FIG. 5, the resonator system 1 may include a supporting member 110 and first through third micromechanical resonators 1000, 2000, and 3000.

The first through third micromechanical resonators 1000, 2000, and 3000, each may have one end fixed on the supporting member 110, may have resonance frequencies different from each other.

The resonator system 1 may include the first micromechanical resonator 1000, the second micromechanical resonator 2000 having a length greater than that of the first micromechanical resonator 1000, and the third micromechanical resonator 3000 having a length greater than that of the second micromechanical resonator 2000.

The third micromechanical resonator 3000 may have a resonance frequency in a lower frequency band. The first and second micromechanical resonators 1000 and 2000 may have resonance frequencies greater than that of the third micromechanical resonator 3000. For example, the third micromechanical resonator 300 may have a resonance frequency of less than or equal to 500 Hz, and the first and second micromechanical resonators 1000 and 2000 may each have a resonance frequency equal to or greater than 200 Hz. The resonance frequency of the first micromechanical resonator 1000 may be greater than that of the second micromechanical resonator 2000.

The third micromechanical resonator 3000 may be one of the micromechanical resonators 100, 100A, and 100B according to example embodiments. The third micromechanical resonator 3000 may include the first supporting beam 120 and the first lumped mass 150 arranged on the first supporting beam 120.

The first supporting beam 120 may include the first fixed end 121 fixed on the supporting member 110 and the first loose end 122 capable of vibrating and having a width greater than that of the first fixed end 121. The first supporting beam 120 may have a T shape. The first supporting beam 120 may have a resonance frequency in a lower frequency band. For example, the first supporting beam 120 may have a resonance frequency of less than or equal to 500 Hz.

The first lumped mass 150 may be arranged on the first loose end 122, and may have a width greater than that of the first fixed end 121. The width of the first lumped mass 150 may be equal to that of the first loose end 122.

The first loose end 122 and the first lumped mass 150 arranged on the first loose end 122 may respectively have first and second air flow paths 1220A and 1500A. The second air flow path 1500A may be arranged to overlap the first air flow path 1220A. The first and second air flow paths 1220A and 1500A may have the same shape. The first and second air flow paths 1220A and 1500A may each have a width equal to or greater than 10 μm.

The first and second micromechanical resonators 1000 and 2000 may respectively include second supporting beams 220A and 220B each having a length smaller than that of the first supporting beam 120, and second lumped masses 250A and 250B arranged on the second supporting beams 220A and 220B.

The second supporting beams 220A and 220B may include second fixed ends 221A and 221B that are fixed on the supporting member 110, and second loose ends 222A and 222B which are capable of vibrating and have widths equal to those of the second fixed ends 221A and 221B.

The second lumped masses 250A and 250B may be arranged on the second loose ends 222A and 222B, and may have widths equal to those of the second fixed ends 221A and 221B. The second lumped masses 250A and 250B may each have a weight smaller than that of the first lumped mass 150.

The third micromechanical resonator 3000 may be arranged between the first and second micromechanical resonators 1000 and 2000. The first supporting beam 120 of the third micromechanical resonator 3000 may be arranged between the first and second micromechanical resonators 1000 and 2000. As described above, the third micromechanical resonator 3000 may have a structure in which a width of the first loose end 122 is increased without increasing a length of the first supporting beam 120 thereof. The first and second micromechanical resonators 1000 and 2000 each having a relatively short length, may be arranged on both sides of the third micromechanical resonator 3000, and thus, an overall length of the resonator system 1 may be not increased although the width of the first loose end 122 is increased. In other words, as described above, when an arrangement of the first through third micromechanical resonators 1000, 2000, and 3000 are used, an increase in a width of the resonator system 1 may be minimized and a length of the resonator system 1 may be reduced.

In the example embodiment described above, a case in which the resonator system 1 includes the first through third micromechanical resonators 1000, 2000, and 3000 is described. However, example embodiments are not limited thereto, and a resonator system may include the resonator system 1 illustrated in FIG. 5 being repeatedly arranged. For example, referring to FIG. 6, the resonator system 1A may include third micromechanical resonators 3000, 3000A, and 3000B. The resonator system 1A may also include the first and second micromechanical resonators 1000 and 2000, first and second micromechanical resonators 1000A and 2000A, and first and second micromechanical resonators 1000B and 2000B, which may be respectively arranged on both sides of the third micromechanical resonators 3000, 3000A, and 3000B.

According to an example array device configured by using the method described above, a device having a reduced area capable of corresponding from a lower frequency to a higher frequency may be manufactured.

The micromechanical resonator according to the example embodiments and a resonator system including the micromechanical resonator may reduce a size of the resonator system while ensuring a lower frequency characteristic.

Also, the micromechanical resonator according to an example embodiment and the resonator system including the micromechanical resonator may reduce a size of the resonator system and may increase sensitivity thereof while ensuring a lower frequency characteristic.

While the example embodiments of a micromechanical resonator and resonator system including the same, and a method of manufacturing the same have been described in detail with reference to accompanying drawings, it should be understood that example embodiments described herein should be considered in a descriptive sense only and not for purposes of limitation. Also, it should be understood that the inventive concept is not limited to the example embodiments described above because various changes in form and details may be made by those of ordinary skill in the art without departing from the spirit and scope of the disclosure as defined by the appended claims.

What is claimed is:

1. A micromechanical resonator comprising:
a supporting beam comprising a fixed end fixed on a supporting member and a loose end configured to vibrate; and
a lumped mass arranged on the loose end,
wherein the loose end has a width greater than a width of the fixed end, and a width of the lumped mass is greater than the width of the fixed end,
wherein the loose end comprises a first air flow path configured to allow air to flow therethrough in an upward direction and a downward direction, and the lumped mass comprises a second air flow path configured to allow air to flow therethrough in the upward direction and the downward direction, and
wherein the first air flow path overlaps the second air flow path, and
wherein the first airflow path and the second air flow path each have a width equal to or greater than 10 µm and smaller than the width of the fixed end.

2. The micromechanical resonator of claim 1, further comprising a piezoelectric sensor that is arranged on the fixed end, the piezoelectric sensor comprising a lower electrode, a piezoelectric material layer, and an upper electrode.

3. The micromechanical resonator of claim 1, wherein the supporting beam has a T shape.

4. The micromechanical resonator of claim 1, wherein the lumped mass has a width equal to the width of the loose end.

5. The micromechanical resonator of claim 1, wherein the first air flow path and the second air flow path have the same shape.

6. The micromechanical resonator of claim 1, wherein the supporting beam has a length less than or equal to 5 mm.

7. The micromechanical resonator of claim 1, wherein the lumped mass has a thickness less than or equal to 10 µm.

8. The micromechanical resonator of claim 1, wherein the micromechanical resonator has a resonance frequency less than or equal to 500 Hz.

9. A resonator system comprising:
a supporting member; and
a plurality of micromechanical resonators, each having an end fixed on the supporting member and having resonance frequencies different from each other,
wherein the plurality of micromechanical resonators comprise a first micromechanical resonator, a second micromechanical resonator having a length greater than that of the first micromechanical resonator, and a third micromechanical resonator having a length greater than that of the second micromechanical resonator, and,
wherein the third micromechanical resonator comprises:
a first supporting beam comprising a first fixed end fixed on the supporting member and a first loose end configured to vibrate and has a width greater than a width of the first fixed end, and
a first lumped mass that is arranged on the first loose end and has a width greater than the width of the first fixed end,
wherein the first loose end comprises a first air flow path configured to allow air to flow therethrough in an upward direction and a downward direction, and the first lumped mass comprises a second air flow path configured to allow air to flow therethrough in the upward direction and the downward direction, and
wherein the first air flow path overlaps the second air flow path, and
wherein the first airflow path and the second air flow path each have a width equal to or greater than 10 µm and smaller than the width of the fixed end.

10. The resonator system of claim 9, wherein each of the first micromechanical resonator and second micromechanical resonator respectively comprise:
a second supporting beam comprising a second fixed end fixed on the supporting member, and a second loose end configured to vibrate and has a width equal to a width of the second fixed end; and
a second lumped mass that is arranged on the second loose end and has a width equal to the width of the second fixed end.

11. The resonator system of claim 10, wherein the first supporting beam of the third micromechanical resonator is arranged between the first and second micromechanical resonators.

12. The resonator system of claim 9, wherein the third micromechanical resonator has a resonance frequency less than or equal to 500 Hz, and the first and second micromechanical resonators each have a resonance frequency greater than 200 Hz.

13. The resonator system of claim 9, wherein the first supporting beam has a T shape.

14. The resonator system of claim 9, wherein the first lumped mass has a width equal to the width of the first loose end.

15. The resonator system of claim 9, wherein the first air flow path and second air flow path have the same shape.

* * * * *